US010763555B2

(12) United States Patent
Fukushima et al.

(10) Patent No.: US 10,763,555 B2
(45) Date of Patent: *Sep. 1, 2020

(54) BATTERY-TYPE POWER SUPPLY DEVICE AND BATTERY-DRIVEN LOAD DEVICE

(71) Applicant: NOVARS INC., Tokyo (JP)

(72) Inventors: Toshitaka Fukushima, Tokyo (JP); Akihiro Okabe, Tokyo (JP)

(73) Assignee: NOVARS INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/425,546

(22) Filed: May 29, 2019

(65) Prior Publication Data

US 2019/0280348 A1    Sep. 12, 2019

Related U.S. Application Data

(63) Continuation of application No. PCT/JP2017/038736, filed on Oct. 26, 2017.

(30) Foreign Application Priority Data

Nov. 30, 2016 (JP) .................................. 2016-232413

(51) Int. Cl.
*H02J 7/00* (2006.01)
*H02J 7/14* (2006.01)
(Continued)

(52) U.S. Cl.
CPC ............ *H01M 10/46* (2013.01); *A63H 29/22* (2013.01); *H02J 7/00* (2013.01); *H02J 7/0068* (2013.01);
(Continued)

(58) Field of Classification Search
USPC ........................................................ 320/107
See application file for complete search history.

(56) References Cited

U.S. PATENT DOCUMENTS

| 10,128,889 B2* | 11/2018 | Koyama | ............ H02J 7/00 |
| 2009/0039833 A1* | 2/2009 | Kitagawa | ........ H02J 7/0031 320/134 |

(Continued)

FOREIGN PATENT DOCUMENTS

| JP | 2006-302733 A | 11/2006 |
| JP | 3143765 U | 8/2008 |
| JP | 2015-177939 A | 10/2015 |

OTHER PUBLICATIONS

International Search Report issued in PCT/JP2017/038736 dated Dec. 12, 2017 with English Translation (4 pages).

*Primary Examiner* — Alexis B Pacheco

(74) *Attorney, Agent, or Firm* — Nakanishi IP Associates, LLC

(57) ABSTRACT

A battery-type power supply device realizes data transmission while also supplying power to a battery-driven external load device in a state in which the battery-type power supply device is mounted in a battery box of the external load device. The battery-type power supply device is mountable in the battery box of the external load device, has a shape and dimensions conforming to battery standards, and is capable of housing a small-size battery therein. An output transistor is interposed between a housed battery and an outer electrode terminal, and opening and closing of the output transistor are controlled by a PWM control section at a duty ratio corresponding to an instruction received from an external information processing device by a radio communication section, so that the battery type power supply device thereby functions as a switching power supply. Opening and closing of the output transistor are controlled by a transmission section in order to transmit data to the external load device through the outer electrode terminal. Connections of the transmission section and the PWM control section to the (Continued)

output transistor is switched by a connection switching section.

8 Claims, 8 Drawing Sheets

(51) Int. Cl.
 *H01M 10/46* (2006.01)
 *A63H 29/22* (2006.01)
 *H03K 17/687* (2006.01)
 *H04Q 9/00* (2006.01)

(52) U.S. Cl.
 CPC .......... *H02J 7/0077* (2013.01); *H03K 17/687* (2013.01); *H04Q 9/00* (2013.01)

(56) References Cited

U.S. PATENT DOCUMENTS

| | | | | |
|---|---|---|---|---|
| 2010/0093401 A1* | 4/2010 | Moran | .................. | G06F 1/1626 455/566 |
| 2010/0141153 A1* | 6/2010 | Recker | .................. | H05B 47/20 315/149 |
| 2014/0273832 A1* | 9/2014 | Kim | ........................ | H02J 5/005 455/41.1 |
| 2015/0256015 A1* | 9/2015 | Gudan | ................... | H02J 50/20 307/104 |

\* cited by examiner

BATTERY-TYPE POWER SUPPLY DEVICE AND BATTERY-DRIVEN LOAD DEVICE

FIELD

Embodiments described herein relate generally to a battery-type power supply device and a battery-driven load device.

BACKGROUND

Patent Literature 1 discloses a radio reception driving device that is mountable in a battery box of an external load device such as an electric toy. The radio reception driving device actuates or stops operation of the external load device such as a toy by causing a transistor interposed between a housed battery and an external electrode to turn on or off according to a user command from an external remote control that is received through a radio reception section.

However, the radio reception driving device cannot perform data communication with the external load device in which the radio reception driving device is housed. In order to realize such communication, it is necessary to separately provide a communication path between the radio reception driving device and the external load device, and there has been the problem that providing such a communication path complicates the structure.

CITATION LIST

Patent Literature

Patent Literature 1: Japanese Utility Model Publication No. 3143765

SUMMARY OF INVENTION

Technical Problem

An object of the present invention is to realize data transmission as well as the supply of power to a battery-driven-type external load device from a battery-type power supply device in a state in which the battery-type power supply device is mounted in a battery box of the external load device.

Solution to Problem

A battery-type power supply device according to one embodiment of the present invention can be mounted in a battery box of an external load device. The battery-type power supply device has a housing having a shape and dimensions which conform to battery standards. In the housing, the battery-type power supply device has a battery housing section for housing a built-in battery on an inner side of the housing. The battery housing section has an inner positive terminal and an inner negative terminal which make contact with front and rear terminals of the built-in battery that is housed in the battery housing section. An outer positive terminal that is connected to the inner positive terminal is provided at a front end face of the housing. An outer negative terminal that is connected to the inner negative terminal is provided at a rear end face of the housing. An output transistor is interposed at least either between the inner negative terminal and the outer negative terminal or between the inner positive terminal and the outer positive terminal. An antenna is housed within the housing. The battery-type power supply device includes: a radio communication section for performing radio communication with an external information processing device through the antenna; a PWM control section that controls opening and closing of the output transistor at a duty ratio in accordance with an instruction received by the radio communication section from the external information processing device; a transmission section that controls opening and closing of the output transistor to transmit data received by the radio communication section from the external information processing device or other data to the external load device through the outer positive terminal and the outer negative terminal; and a connection switching section that switches between connections of the PWM control section and the transmission section to the output transistor.

DETAILED DESCRIPTION

Figure 1:
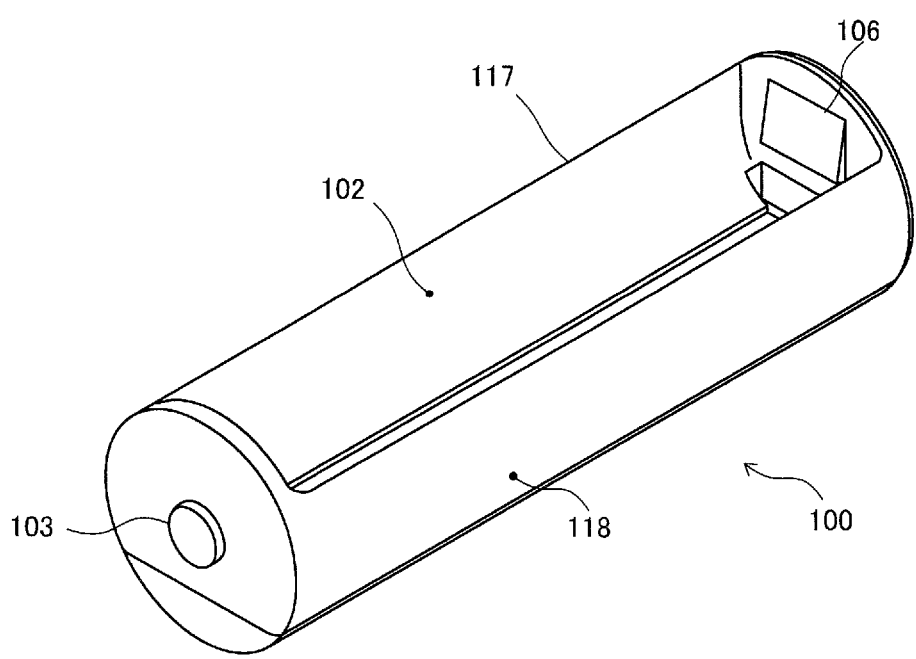
FIG. 1 is a perspective view illustrating the external appearance of a battery-type power supply device equipped with a radio communication function according to the present embodiment.

Hereunder, a battery-type power supply device equipped with a radio communication function according to one embodiment of the present invention is described with reference to the drawings. In the following description, the same reference numerals are assigned to constituent elements having substantially the same functions and constitutions, and duplicated explanation is made only when necessary.

The battery-type power supply device according to the present embodiment has a shape and dimensions (external dimensions) that conform to battery standards, and is mounted in a battery box of an external load device. The battery-type power supply device houses a small-size battery (built-in battery) therein. The battery-type power supply device also has a radio communication section for performing radio communication with an external information processing device such as an external smartphone. The battery-type power supply device includes a switching element (hereunder, referred to as "output transistor") that is interposed between the built-in battery and one of an outer positive terminal and an outer negative terminal that are provided at both ends of the battery-type power supply device, and realizes a PWM power supply function (switching power supply function) that adjusts an output voltage by pulse width modulation (PWM) by controlling opening and closing of the output transistor according to an instruction received from the external information processing device. Note that, the battery-type power supply device according to the present embodiment is not limited to a device equipped with a PWM function, and may be a device that is equipped with only a power supply on/off function that is implemented by switching the output transistor on or off.

The external load device is driven upon receiving power that is supplied through the outer positive terminal and outer negative terminal of the battery-type power supply device. A user can operate the external information processing device to drive the external load device at an arbitrary voltage. In the battery-type power supply device according to the present embodiment, the outer positive terminal and outer negative terminal for supplying power also serve as communication terminals for transmission and reception of data to and from the external information processing device.

Figure 2:
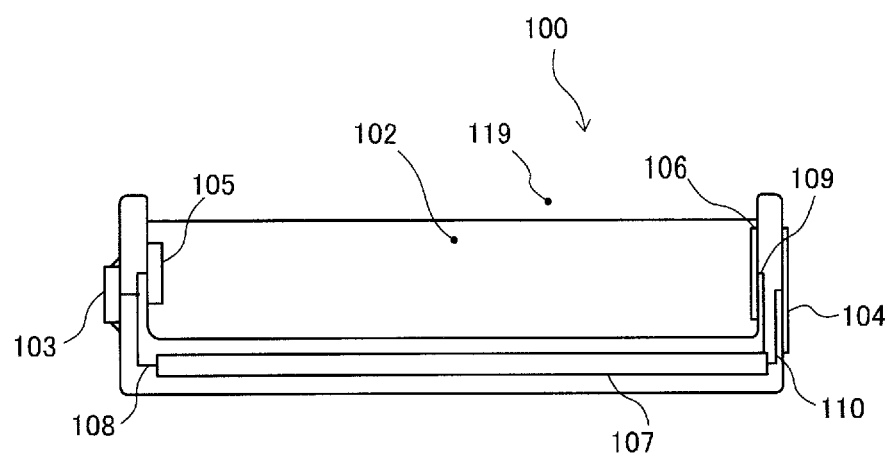
FIG. 2 is a view illustrating the internal structure of the battery-type power supply device of the present embodiment.

FIG. 1 is a perspective view illustrating the external appearance of a battery-type power supply device 100 equipped with a radio communication function according to the present embodiment. FIG. 2 is a view illustrating the internal structure of the battery-type power supply device 100 according to the present embodiment. The battery-type power supply device 100 that is equipped with a radio communication function according to the present embodiment (hereunder, referred to simply as "battery-type power supply device 100") is made with a shape and external dimensions that conform to battery standards. Typically, the battery-type power supply device 100 is formed in the shape of a circular cylindrical body having a height and diameter that conform to the AA standard. However, the battery-type power supply device 100 may be formed to have a shape and dimensions that conform to another battery standard. In the present specification, the battery-type power supply device 100 is described on the assumption that the battery-type power supply device 100 conforms to the AA standard.

A main body 117 of the battery-type power supply device 100 is sheathed by a housing 118 having a cylindrical body which has the same shape and dimensions as the AA battery standard. A circular conductive plate as an outer positive terminal 103 is attached at the center of a top end face (also referred to as "front end face") of the main body 117. A circular conductive plate as an outer negative terminal 104 is attached at the center of a bottom end face (also referred to as "rear end face") of the main body. A portion of the peripheral surface of the housing 118 is notched in an oval shape. The length of the notched part 119 is typically equal to the length of an AAA dry battery, and the width is somewhat wider than the width of an AAA dry battery. A user can insert an AAA battery into a battery housing section 102 through the notched part 119, or can remove the AAA battery therefrom through the notched part 119. The shape of the battery housing section 102 is that of a cylindrical space having a length and diameter conforming to the AAA standard. The central axis of the battery housing section 102 is offset in a radial direction with respect to the cylindrical central axis of the battery-type power supply device 100. This offset provides a small space between the housing 118 and the battery housing section 102. A substrate 107 that realizes various functions of the battery-type power supply device 100 is mounted in this small space.

A conductive plate is attached as an inner positive terminal 105 at the center of the front end of the battery housing section 102, that is, on the same side as the outer positive terminal 103. A conductive plate having a spring property is attached as an inner negative terminal 106 at the center of the rear end of the battery housing section 102, that is, on the same side as the outer negative terminal 104. The positive terminal of the AAA dry battery housed in the battery housing section 102 contacts the inner positive terminal 105, and the negative terminal of the AAA dry battery contacts the inner negative terminal 106. The inner positive terminal 105 is connected to the outer positive terminal 103 and the substrate 107 through a distribution cable 108. The inner positive terminal 105 and the outer positive terminal 103 may be constituted by a common conductive plate. The inner negative terminal 106 is connected to the substrate 107 by a distribution cable 109. The outer negative terminal 104 is connected to the substrate 107 by a distribution cable 110.

Figure 3:
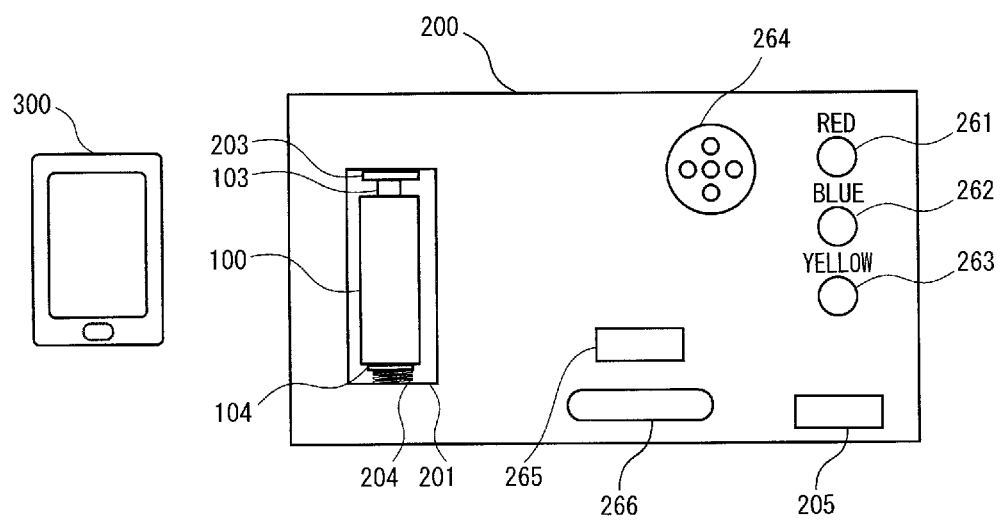
FIG. 3 is a view illustrating a mode of use of the battery-type power supply device according to the present embodiment.

FIG. 3 is a diagram showing a mode of use of the battery-type power supply device 100 illustrated in FIG. 1. An external load device 200 is, for example, a device that is driven by a single AA dry battery. The external load device 200 has a battery box 201. A battery-type power supply device is mounted in the battery box 201. In a state in which the battery-type power supply device 100 is mounted in the battery box 201, the outer positive terminal 103 of the battery-type power supply device 100 contacts a positive terminal 203 of the battery box 201, and the outer negative terminal 104 contacts a negative terminal 204 of the battery box 201. The external load device 200 is a device that has a load, for example, a motor, an LED, various sensors, a speaker or the like. Specifically, the external load device 200 is, for example, an electric toy, a toy electric tool, a disaster prevention sensor, a security sensor, a flashlight, a bicycle light, a battery-powered cooker, an electric float, an electric pet feeding device, a battery-powered fan, or a battery-powered hand soap dispenser. In this case, the external load device 200 includes a red LED 261, a blue LED 262, a green LED 263, a speaker 264, a push-button switch 265 and a temperature sensor 266. Driving of these loads is controlled by a control section within an integrated circuit (IC) 250 inside the external load device 200. An electrical connection between the IC 250 and the battery box 201 is made when a power switch 205 is turned on, and is disconnected when the power switch 205 is turned off.

An external information processing device 300 is a device equipped with a communication function and an operation function or the like such as a smartphone, a portable telephone, a tablet terminal, or a radio control communication device. By operating the external information processing device 300, a user can select a load for opening and closing, and can set the output of the load to an arbitrary value between a PWM signal of 0% (no driving signal output) and a PWM signal of 100% (maximum driving signal output). Thereby, when the red LED 261 is lit, the user can operate the external information processing device 300 to adjust the amount of light of the red LED 261 that is lit.

The external load device 200 is not equipped with a radio communication function. The battery-type power supply device 100 according to the present embodiment that is mounted in the battery box 201 of the external load device 200 receives a radio signal that is sent from the external information processing device 300, instead of the external load device 200. The battery-type power supply device 100 can adjust the power supply output by controlling the output transistor of the battery-type power supply device 100 to open or close by means of a PWM signal that is in accordance with an output instruction value received from the external information processing device 300. On the other hand, when the battery-type power supply device 100 receives an operation instruction from the external information processing device 300, it is necessary for the battery-type power supply device 100 to transmit the operation instruction to the IC 250 of the external load device 200. The battery-type power supply device 100 according to the present embodiment is configured to be capable of performing data communication with the external load device 200 in which the battery-type power supply device 100 is mounted. Specifically, data communication between the battery-type power supply device 100 and the external load device 200 is performed through electrode terminals 103 and 104.

Figure 4:
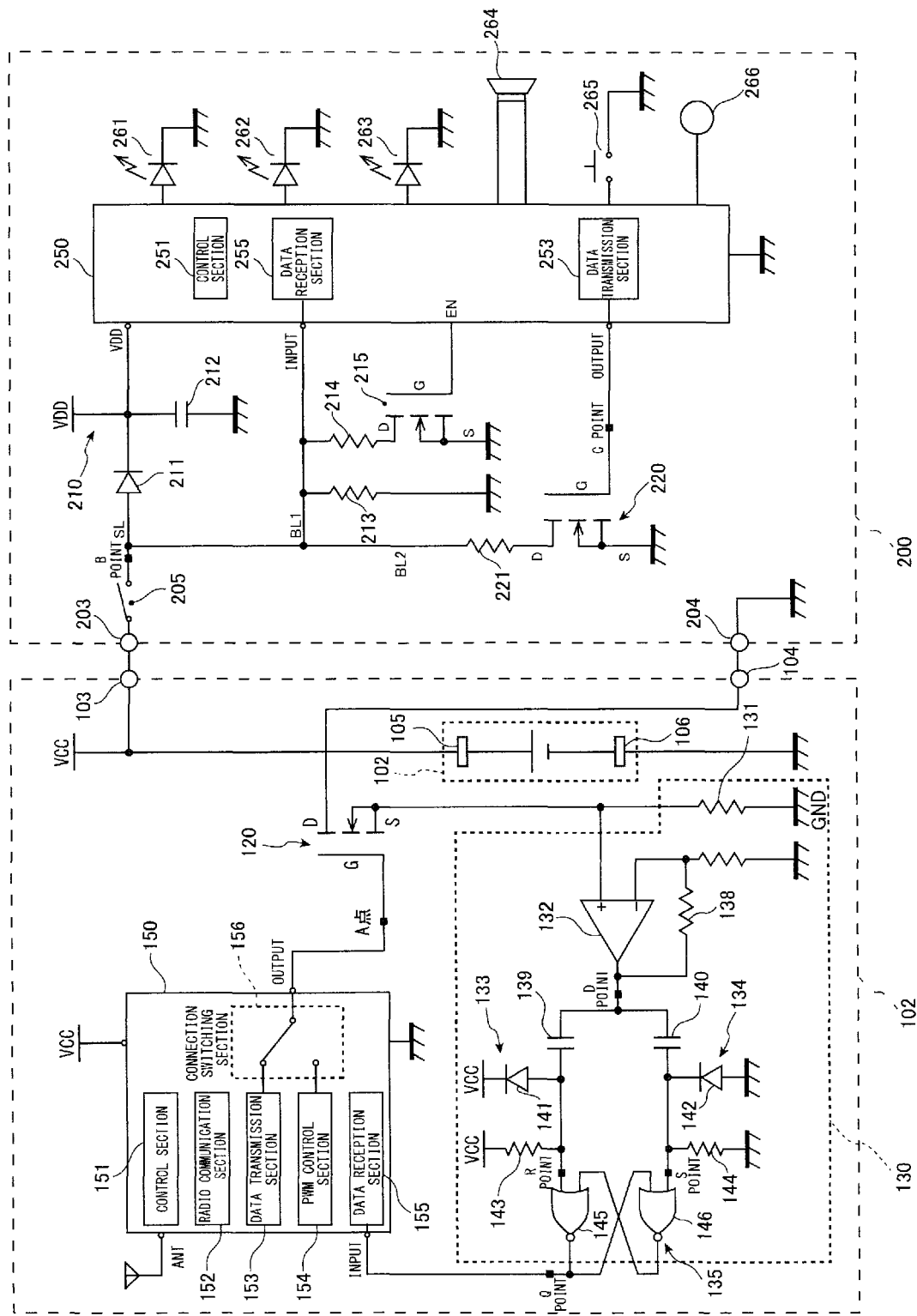
FIG. 4 is an overall equivalent circuit diagram of the battery-type power supply device according to the present embodiment and an external load device in which the battery-type power supply device is mounted.

(FIG. 4: Overall Configuration)

FIG. 4 illustrates an example of an equivalent circuit diagram of the external load device 200 in which the battery-type power supply device 100 is mounted according to the present embodiment. The battery-type power supply device 100 includes a data reception circuit 130, an RFIC 150, and an output transistor 120. The external load device 200 includes a power supply circuit 210, the IC 250, and a second output transistor 220. The transistor 120 for PWM switching of the battery-type power supply device 100, and the second output transistor 220 for data transmission of the external load device 200 are typically n-type MOSFETs.

(Battery-Type Power Supply Device 100)

A gate G of the first output transistor 120 of the battery-type power supply device 100 is connected to an output terminal of the RFIC 150, a source S is connected to a first ground GND through a detection resistor 131, that is, is connected to a ground on the battery-type power supply device 100, and a drain D is connected to the outer negative terminal 104. The inner negative terminal 106 of the battery-type power supply device 100 is connected to the first ground, and the inner positive terminal 105 is connected to the outer positive terminal 103. Note that, a configuration may be adopted in which, for example, an unshown DC-DC converter is connected to the inner positive terminal 105, and the voltage of the AAA dry battery that is mounted in the battery housing section 102 is boosted to a power supply voltage of, for example, 3.0 V for operation of the RFIC 150.

The data reception circuit 130 is a circuit that converts a signal that was transmitted from the external load device 200 into data that is handled by the RFIC 150. The data reception circuit 130 includes the detection resistor 131, an operational amplifier 132, a differentiation circuit 133 for detecting a falling signal, a differentiation circuit 134 for detecting a rising signal, and a latch circuit 135. The detection resistor 131 is interposed between the source of the first output transistor 120 and the first ground. The voltage across both ends of the detection resistor 131 is input to a noninverting input terminal (+) of the operational amplifier 132. A feedback path along which a resistor 138 is interposed is connected to an inverting input terminal (−) of the operational amplifier 132. The differentiation circuits 133 and 134 are connected to the output of the operational amplifier 132. In the differentiation circuit 133 for detecting a falling signal, a diode 141 is arranged in the forward direction in parallel with a resistor 143 in a CR circuit that includes a capacitor 139 and the resistor 143. In the differentiation circuit 134 for detecting a rising signal, a diode 142 is arranged in the reverse direction in parallel with a resistor 144 in a CR circuit that includes a capacitor 140 and the resistor 144. The latch circuit 135 is a so-called "SR latch" in which a pair of NOR circuits 145 and 146 are interconnected with a cross-feedback loop. The differentiation circuits 133 and 134 are connected to an R end and an S end of the latch circuit 135, respectively. The output of the latch circuit 135 is connected to an input 2 terminal of the RFIC 150.

The RFIC 150 is driven by a power supply VCC of a built-in battery housed in the battery housing section 102 or by a power supply voltage that was boosted by the DC-DC converter. The RFIC 150 performs unified control of the battery-type power supply device 100. A radio communication antenna 121 that is housed inside the housing is connected to an ANT terminal of the RFIC 150, the gate of the first output transistor 120 is connected to the output terminal, and the output of the latch circuit 135 is connected to an input 2 terminal.

The RFIC 150 includes functions of a control section 151, a radio communication section 152, a data transmission section 153, a PWM control section 154, a data reception section 155 and a connection switching section 156. The radio communication section 152 performs radio communication in conformity with the Bluetooth (registered trademark) standard or the like with the external information processing device 300 through the radio communication antenna 121 according to control of the control section 151. The radio communication section 152 receives a coded radio signal representing an operation instruction and a coded radio signal representing an output instruction value from the external information processing device 300. The term "operation instruction" refers to, for example, an operation instruction for a function that a user selects by operating the external information processing device 300 from among multiple functions which the external load device 200 is equipped with, such as "light the red LED 261 of the external load device 200" or "turn on the temperature sensor 266 of the external load device 200". A PWM output instruction value is, for example, a value that a user selects from among percentages from 0% to 100% by operating the external information processing device 300. Thereby, the user can stop operation of the external load device 200 or actuate the external load device 200, or vary the strength during operation of the external load device 200, and for example, can open and close the red LED 261, and also adjust the amount of light of the red LED 261 that is lit.

In accordance with control of the control section 151, the PWM control section 154 generates a gate control signal (also referred to simply as "driving signal") of the output transistor 120 that is in accordance with an output instruction value that is received. In this case, the driving signal is provided by means of a PWM (pulse width modulation) signal. In a case where the output instruction value is 0%, the PWM control section 154 generates a PWM signal with a duty ratio of 0% (low level only). In a case where the PWM output instruction value is 100%, the PWM control section 154 generates a PWM signal with a duty ratio of 100% (high level only). In a case where the PWM output instruction value is 50%, the PWM control section 154 generates a PWM signal with a duty ratio of 50% (ratio between low level and high level is one-half). The PWM signal that is generated by the PWM control section 154 is input as a gate control signal to the gate of the first output transistor 120.

Data communication between the battery-type power supply device 100 and the external load device 200 is performed, for example, by serial communication using an asynchronous method. Here, a format in which a start bit is one bit, a stop bit is one bit, there is no parity bit, and the number of data bits is eight bits will be described as the data format of the serial communication that uses an asynchronous method. Although a common asynchronous method is described here, the data communication may also be performed by synchronous communication. Further, the communication rate (inverse of one bit period) between the battery-type power supply device 100 and the external load device 200 is set in advance to a prescribed value. Further, the battery-type power supply device 100 and the external load device 200 each hold data of a correspondence table in which data bodies and operation instructions are associated.

In accordance with control by the control section 151, the data transmission section 153 transmits a data signal including a total of 10 bits in which a start bit and a stop bit are attached to a data body of 8 bits that corresponds to a received operation instruction, bit-by-bit at a predetermined communication rate. For example, the start bit of the data signal that is transmitted from the external load device 200 to the battery-type power supply device 100 is a low level, and the stop bit is a high level. In the data signal, for example, "1" of a binary signal is represented by a high-level signal, and "0" of a binary signal is represented by a low-level signal. The data signal that is generated by the data transmission section is input as a gate control signal of the output transistor.

Note that, a high level of a PWM signal generated by the PWM control section 154 and a high level of a data signal generated by the data transmission section 153 are voltage values that are sufficiently higher than a threshold voltage Vth of the first output transistor 120. Typically, the high level of the PWM signal and the high level of the data signal are the same voltage value. In a state in which a high-level signal is input to the gate, the first output transistor 120 is in an "on" state. The term "low level" refers to a voltage value that is sufficiently lower than the threshold voltage Vth of the first output transistor 120. Typically, the low level of the PWM signal and the low level of the data signal are the same voltage value. In a state in which a low-level signal is input to the gate, the first output transistor 120 is in an "off" state.

The data reception section 155 constantly monitors signals that are input to the input 2 terminal of the RFIC 150. Upon detecting a start bit, the data reception section 155 receives a data body of 8 bits at a predetermined communication rate, and after confirming that the next bit is a stop bit the data reception section 155 ends reception of the signal. In accordance with control by the control section 151, the radio communication section 152 transmits to the external information processing device 300 a coded radio signal in accordance with the data body that was transmitted from the external load device 200 and received by the data reception section 155. The data body transmitted from the external load device 200 relates to, for example, a detected temperature value that was detected by the temperature sensor 266, or the number of times that the push-button switch 265 was depressed.

In accordance with control by the control section 151, the connection switching section 156 switches the connection destination of the gate of the first output transistor 120 to the PWM control section 154 or the data transmission section 153. The data transmission is repeated at a predetermined timing in accordance with a predetermined transmission rule. The data transmission is typically performed immediately after the power switch 205 is turned on and is further repeated at a fixed period after the power switch 205 was turned on. A control section 251 controls a data reception section 255 so as to execute data reception according to the same rule as the data transmission, so that data reception at the external load device 200 is performed in synchrony with the data transmission.

(External Load Device 200)

The negative terminal 204 of the battery box 201 is connected to a second ground, that is, a ground on the external load device 200 side. The positive terminal 203 of the battery box 201 is connected to a VDD terminal of the IC 250 (IC on the external load device 200 side) through the power switch 205 and the power supply circuit 210. The power supply circuit 210 generates a drive voltage for the IC based on a voltage waveform that is input. The power supply circuit 210 includes a rectifying diode 211 and a smoothing capacitor 212. An input terminal of the diode 211 is connected to the positive terminal 203 of the battery box 201, and an output terminal of the diode 211 is connected to the VDD terminal of the IC 250. The smoothing capacitor 212 is interposed between the output terminal of the diode 211 and the second ground.

Further, a branch line BL1 that branches from a power supply line SL that is connected to the power switch 205 is connected to an input 1 terminal of the IC 250. A pair of pull-down resistors 213 and 214 are provided in parallel with each other on the branch line BL1. One pull-down resistor 214 is connected to a ground via a switching element (transistor) 215. The base of the transistor 215 is connected to an EN terminal of the IC 250. The transistor 215 is opened and closed in order to vary the pull-down resistor value in accordance with a predetermined reception rule or a determination as to whether or not reception data is received in accordance with control by the control section 251.

A branch line BL2 that branches from the power supply line SL is connected to the negative terminal 204 via a resistor 221 and the source of the second output transistor 220. The gate of the second output transistor 220 is connected to the output terminal of the IC 250. The second output transistor 220 is opened and closed in accordance with transmission data from a transmission section 253. The voltage across both ends of the detection resistor 131 of the battery-type power supply device 100 varies according to opening and closing of the second output transistor 220.

The red LED 261, the blue LED 262, the green LED 263, the speaker 264, the push-button switch 265 and the temperature sensor 266 are connected to the IC 250. The IC 250 is driven by a power supply voltage supplied from the power supply circuit 210, and performs unified control of the external load device 200. The IC 250 includes the functions of the control section 251, the data transmission section 253 and the data reception section 255.

In accordance with control by the control section 251, the data transmission section 253 transmits a data signal including a total of 10 bits in which a start bit and a stop bit are attached to a data body of 8 bits that corresponds to a detection value for the temperature that was detected by the temperature sensor 266, or the number of times the push-button switch 265 was depressed or the like, at a predetermined communication rate. For example, the start bit of the data signal that is transmitted from the external load device 200 to the battery-type power supply device 100 is a low level, and the stop bit is a high level. In the data signal, for example, "1" of a binary signal is represented by a high-level signal, and "0" of a binary signal is represented by a low-level signal. The data signal that is generated by the data transmission section 253 is input as a gate control signal to the gate of the second output transistor 220. Note that, the high level of the data signal generated by the data transmission section 253 is a voltage value that is sufficiently higher than a threshold voltage Vth of the second output transistor 220. In a state in which a high-level signal is input to the gate, the second output transistor 220 is in an "on" state. The term "low level" refers to a voltage value that is sufficiently lower than the threshold voltage Vth of the second output transistor 220. In a state in which a low-level signal is input to the gate, the second output transistor 220 is in an "off" state.

The data reception section 255 constantly monitors signals that are input to the input 1 terminal of the IC 250. Upon detecting a start bit, the data reception section 255 receives a data body of 8 bits at a predetermined communication rate, and after confirming that the next bit is a stop bit the data reception section 255 ends reception of the signal. The control section 251 refers to the table in which data bodies and operation instructions are associated, and identifies the operation instruction corresponding to the data body received by a data reception section 183 and executes processing according to the identified operation instruction. A driver is connected to each of the red LED 261, the blue LED 262, the green LED 263 and the speaker 264. The drivers are connected to the power supply line SL. The drivers generate a drive voltage for the load that is connected, based on a power supply voltage supplied from the power supply line SL. Each driver drives the connected load according to control of the control section 251. In accordance with an operation instruction that is received by the data reception section 255, the control section 251 individually opens or closes the aforementioned drivers and also transmits a control signal to each driver. For example, if the operation instruction is "light the red LED 261", the control section 251 turns on the driver of the red LED 261 and, together therewith, transmits a control signal for lighting the red LED 261 to the driver. If the operation instruction is "play music through the speaker 264", the control section 251 turns on the driver of the speaker 264 and, together therewith, outputs an audio signal for generating a beep sound, a speech sound or music from the speaker 264 to the driver.

(Data Transmission from Battery-Type Power Supply Device 100 to External Load Device 200)

Figure 5:
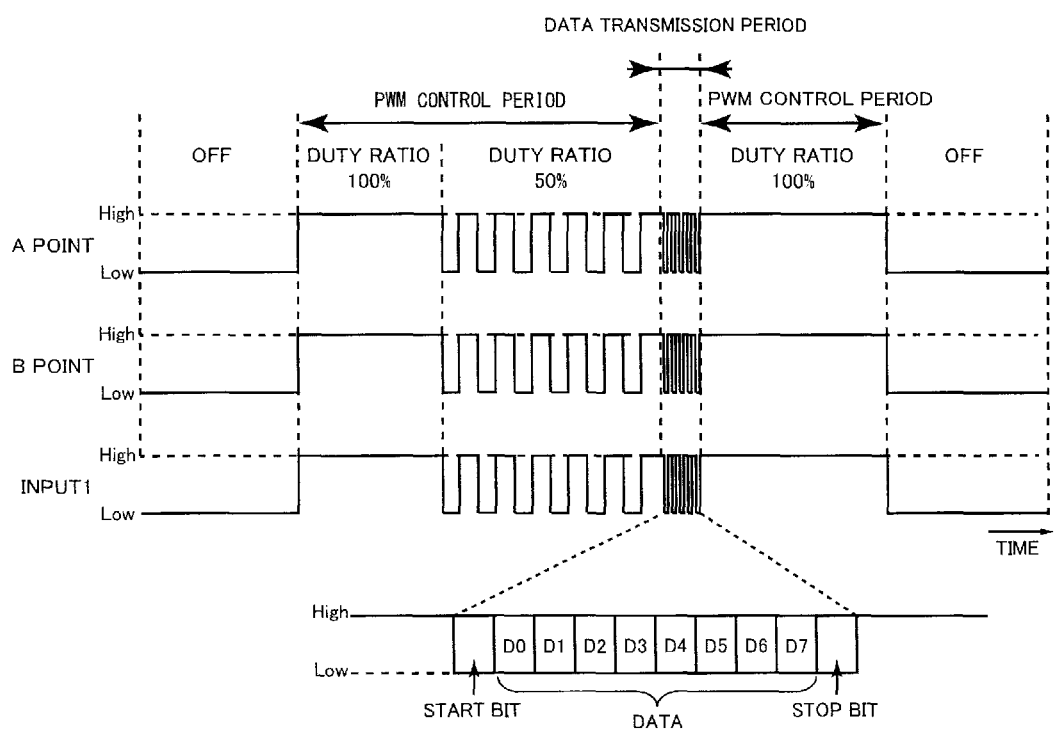
FIG. 5 is a timing chart for describing data transmission operations for transmission of data from the battery-type power supply device to the external load device in the present embodiment.

Circuit operations when transmitting data from the battery-type power supply device 100 to the external load device 200 will now be described referring to FIG. 4 and FIG. 5. The observation waveforms at an A point, a B point and an input 1 in FIG. 4 are illustrated in FIG. 5. Data transmission is possible when the power switch 205 is in an "on" state. A current loop is formed between the battery-type power supply device 100 and the external load device 200. Specifically, a positive power supply side of the current loop is formed by a path from a battery 101 to a second power supply VDD of the IC 250 through the electrode terminals 105, 103, 203 and the power switch 205. In this case, the loads are the IC 250, the resistor 221, the resistor 213, the resistor 214, the drivers, the LEDs 261 to 263, and the speaker 264, and through these loads a ground (return of current) is formed by a path from the second ground (ground of the IC 250, cathodes of the LEDs 261 to 263, source of the transistor 220, ground side of the resistor 213, and source of the transistor 215) via the negative terminal 204 of the battery box 201 and the outer negative terminal 104 of the battery-type power supply device 100, and that passes through the drain of the output transistor 120, the source of the output transistor 120, the detection resistor 131, the first ground and the inner negative terminal 106 to reach the built-in battery 101.

When the first output transistor 120 is in an "off" state, a current does not flow from the built-in battery 101 to the IC 250 since the path between the first ground and the second ground on the negative terminal side is interrupted by the first output transistor 120. That is, a timing at which a high level and a low level of a voltage waveform that can be observed at the B point on the signal line BL1 that is connected to the IC 250 are switched is the same as a timing at which a high level and a low level of a voltage waveform (signal waveform at A point in FIG. 5) that is input to the gate of the first output transistor 120 are switched.

When an output instruction that is received from the external information processing device 300, the connection switching section 156 connects the PWM control section 154 to the gate of the first output transistor 120 in accordance with control of the control section 151. The PWM control section 154 generates a PWM signal with a duty ratio in accordance with the output instruction value. The first output transistor 120 is opened and closed by the PWM signal that is input to the gate. On the other hand, when an operation instruction is received from the external information processing device 300, in accordance with control by the control section 151, the connection switching section 156 connects the data transmission section 153 to the gate of the first output transistor 120. The data transmission section 153 generates a data signal in accordance with the operation instruction. The first output transistor 120 is opened and closed by the data signal that is input to the gate.

As illustrated in FIG. 5, power supply output from the battery-type power supply device 100 and data transmission from the battery-type power supply device 100 to the external load device 200 are performed in a time division manner. A PWM signal and a data signal are each a gate control signal that opens or closes the first output transistor 120. The difference between the PWM signal and the data signal is that while the PWM signal is a signal in which a high level and a low level change regularly at predetermined periods, and data is not included in the signal waveform itself, the data signal is a signal that represents data of the data body that is in accordance with an operation instruction by means of a high level and a low level. Therefore, when a PWM signal is input to the gate of the first output transistor 120, a voltage waveform that has a waveform in which a high level and a low level are switched at the same periods as the PWM signal is input to the input 1 terminal of the IC 250. In contrast, when a data signal is input to the gate of the first output transistor 120, a voltage waveform that is similar to the data signal is input to the input 1 terminal of the IC 250. The data reception section 255 of the IC 250 can monitor the voltage waveform that is input to the input 1 terminal, and can receive a signal in accordance with the data signal that was transmitted from the battery-type power supply device 100.

Figure 8A:
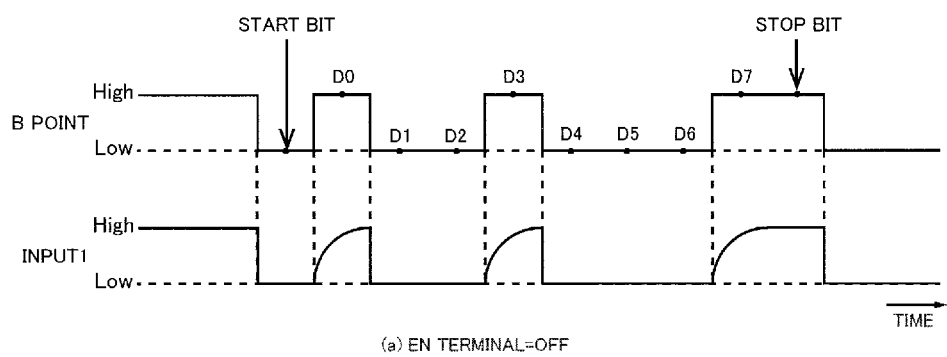
FIGS. 8A and 8B are views for describing actions caused by pull-down resistors shown in FIG. 4.
Figure 8B:
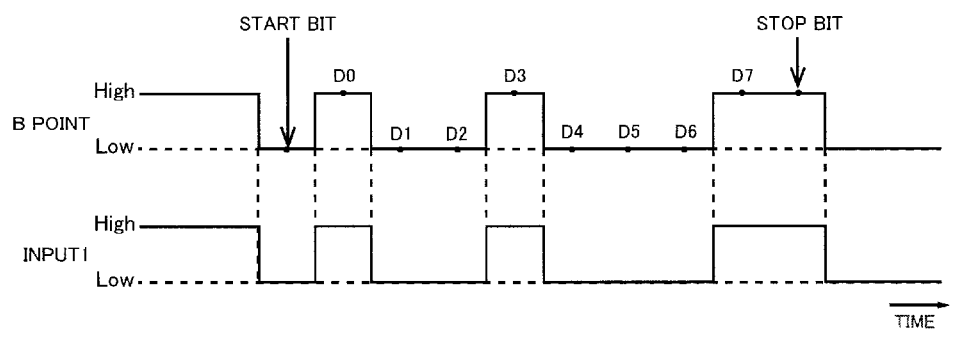

In some cases a signal waveform to be transmitted from the battery-type power supply device 100 to the external load device 200 is blunted, and as a result a reception error occurs with respect to the data signal at the data reception section 255 (FIG. 8A). When there is an excessive capacitance between the electrode terminals 203 and 204, a voltage change in a reception signal having a sharp rectangular wave or the like is blunted. To avoid this, during data reception or when a receiving error occurs with respect to a data signal to be received by the data reception section 255, the control section 251 of the IC 250 outputs a high-level gate control signal from the EN terminal to turn on the transistor 215. Thereby, since the pull-down resistor value is represented by the combined resistor value of the resistor values of the first pull-down resistor 213 and the second pull-down resistor 214, the pull-down resistor value becomes smaller than the resistor value of the first pull-down resistor 213 alone, and the time constant when the first output transistor 120 is "off" can be decreased and the bluntness of the signal waveform can be improved (FIG. 8B).

(Battery-Type Power Supply Device 100 Receives Data from External Load Device 200)

Figure 6:
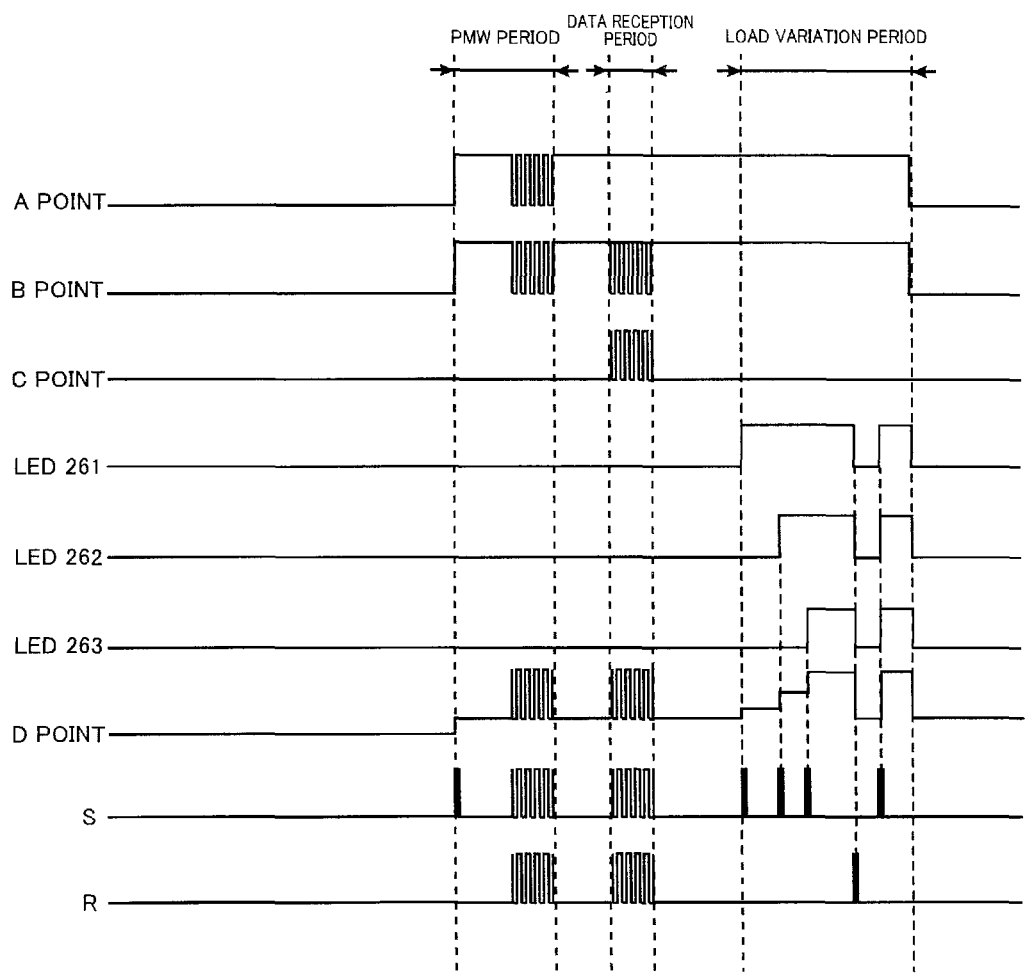
FIG. 6 is a timing chart for describing operations whereby the battery-type power supply device receives data from the external load device in the present embodiment.
Figure 7:
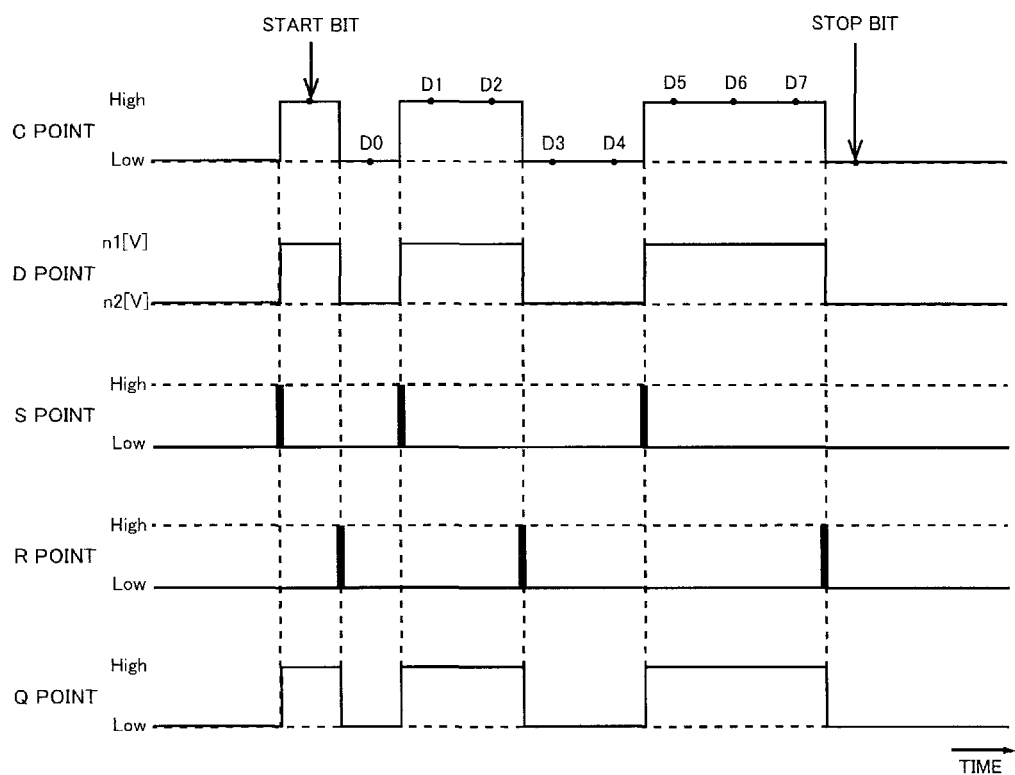
FIG. 7 is a supplementary explanatory diagram for supplementing the description of FIG. 6.

Operations when the battery-type power supply device 100 receives data from the external load device 200 will now be described referring to FIG. 4, FIG. 6 and FIG. 7. FIG. 7 is an enlarged view of a data reception period shown in FIG. 6. It is assumed that the power switch 205 is in an "on" state. As illustrated in FIG. 6, it is possible for the battery-type power supply device 100 to receive data from the external load device 200 in a period in which the first output transistor 120 thereof is in an "on" state.

In the data reception period in FIG. 6, when the battery-type power supply device 100 receives data from the external load device 200, the data transmission section 253 of the external load device 200 outputs a gate signal which changes the transmission data at a predetermined communication rate from the output terminal (voltage waveform of C point in FIG. 6). The second output transistor 220 turns on when a high level of the data signal is input, and turns off when a low level of the data signal is input. When the second output transistor 220 is turned on, the positive terminal 203 of the battery box 201 is connected to the second ground through the resistor 221, and a current arises.

When the external load device 200 is regarded as one load that is connected in series to the built-in battery 101, the resistance value of the external load device 200 varies according to opening and closing of the second output transistor 220. When the second output transistor 220 is turned on, because a state is entered in which the resistor 221 is connected in parallel to the IC 250 between the positive terminal 203 of the battery box 201 and the second ground, the resistance value of the external load device 200 decreases compared to the resistance value of the external load device 200 in a state in which the second output transistor is turned off. Therefore, the value of a current flowing through the overall circuit when the second output transistor 220 is turned on is larger than the value of a current flowing through the overall circuit when the second output transistor 220 is turned off. Thus, a voltage across both ends of the detection resistor 131 when the second output transistor 220 is turned off is greater than the voltage across both ends of the detection resistor 131 when the second output transistor 220 is turned on. That is, a voltage waveform relating to the detection resistor 131 exhibits a similar waveform to the waveform of the data signal that is output from the output terminal of the IC 250.

A detection voltage that is detected at the detection resistor 131 is subjected to in-phase amplification by the operational amplifier 132 of the data reception circuit 130 (voltage waveform for D point in FIG. 7). Here, the high-level voltage value of the voltage waveform after amplification is taken as "n1" and the low-level voltage value after amplification is taken as "n2". The amplification factor of the operational amplifier is adjusted so that n1 becomes equal to or greater than a threshold value of the next logic circuit thereafter, and n2 becomes less than the threshold value. The amplified voltage waveform is input into the fall differentiation circuit 133 and the rise differentiation circuit 134. At the fall differentiation circuit 133 and the rise differentiation circuit 134, rising and falling of the voltage waveform is detected by the respective capacitors 139 and 140.

At a time that the output of the D point rises, at the rise differentiation circuit 134 a pulse is input to an S point at the time constant of the capacitor 140 and the resistor 144. Although at this time a voltage that is equal to or greater than VCC is applied to the fall differentiation circuit 133, the voltage is discharged through the diode 141. Further, at a time that the output of the D point falls, at the fall differentiation circuit 133 a negative pulse is input to an inverter at the time constant of the capacitor 139 and the resistor 143. Although at this time a negative voltage is input to the rise differentiation circuit 134, the voltage is discharged by the diode 142. Accordingly, only a falling edge of the voltage waveform is detected at the fall differentiation circuit 133 (voltage waveform of S point in FIG. 7), and only a rising edge of the voltage waveform is detected at the rise differentiation circuit 134 (voltage waveform of R point in FIG. 7). When the S point exhibits a "high level", the output of the latch circuit 135 becomes a "high level", and the "high level" is maintained until the R point exhibits a "high level". By these operations, a signal that is approximately the same as the data signal that was output from the output terminal of the IC 250 can be input to the input 2 terminal of the RFIC 150. The data reception section 155 of the RFIC 150 outputs the data that was transmitted from the external load device 200 to the control section 151.

A voltage value that is detected at the detection resistor 131 fluctuates depending on the size of the current flowing through the overall circuit, that is, the amount of the load driving the LED 261 and the like in the external load device 200. Therefore, if the voltage value detected at the detection resistor 131 is directly input to the input 2 terminal of the RFIC 150, determination of a high level will become unstable. If the threshold value for determining a high level is increased, when a voltage value detected at the detection resistor 131 is small, it will not be possible to determine the voltage value as being a high level, while if the threshold value is set to a low value, the threshold value will be susceptible to the influence of noise. The data reception circuit 130 of the battery-type power supply device 100 according to the present embodiment improves the reconstruction accuracy with respect to the waveform of the original data signal by detecting rising and falling of the voltage waveform after amplification. Thereby, the data reception circuit 130 can allow fluctuation of the voltage value of the detection resistor 131, and can improve the communication accuracy of data communication between the battery-type power supply device 100 and the external load device 200.

Note that, when the output transistor 120 is "on" in FIG. 6, a detected voltage value at the data reception circuit 130 fluctuates in the PWM period and also in a load variation period such as when lighting of the LEDs 261 to 263 changes. At a rising edge and a falling edge of such fluctuations, the differentiation circuits 133 and 134 of the battery-type power supply device 100 generate a pulse, the pulse is converted into a rectangular signal by the latch circuit 135, and the rectangular signal is provided to the data reception section 155 of the battery-type power supply device 100. A variable period of the rectangular signal differs from the variable period of the communication rate of the asynchronous method that is predefined for the battery-type power supply device 100 and the external load device 200. Accordingly, it is possible to discriminate between data reception and a process other than data reception at the data reception section 155.

According to the battery-type power supply device 100 of the present embodiment that is described above, by opening and closing the first output transistor 120 by inputting a data signal into the gate of the first output transistor 120 as a gate control signal, a waveform corresponding to the data signal can be input into the input 1 terminal of the IC 250 of the external load device 200. On the other hand, in the external load device 200, the second output transistor 220 can be opened and closed by inputting a data signal into the gate of the second output transistor 220 as a gate control signal. By causing the second output transistor 220 to open and close, the detection resistor 131 can be caused to generate a waveform corresponding to the data signal. By passing through the data reception circuit 130, the data signal can be reconstructed based on the voltage waveform detected by the detection resistor 131. Thus, the reconstructed data signal can be input to the input 2 terminal of the RFIC 150 of the battery-type power supply device 100. That is, the battery-type power supply device 100 can perform data communication with the external load device 200 in which the battery-type power supply device 100 is mounted, through the electrodes of the battery-type power supply device 100 and the external load device 200.

Note that, in a case where sensors are not mounted in the external load device 200, it suffices that data transmission can be performed only from the battery-type power supply device 100 to the external load device 200. At such time, the reception circuit and data reception section of the battery-type power supply device 100 can be omitted.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

REFERENCE SIGNS LIST

100 . . . BATTERY-TYPE POWER SUPPLY DEVICE, 200 . . . EXTERNAL LOAD DEVICE, 300 . . . EXTERNAL INFORMATION PROCESSING DEVICE, 120 . . . OUTPUT TRANSISTOR, 121 . . . RADIO COMMUNICATION ANTENNA, 130 . . . DATA RECEPTION CIRCUIT, 131 . . . DETECTION RESISTOR, 132 . . . OPERATIONAL AMPLIFIER, 133, 134 . . . DIFFERENTIATION CIRCUIT, 135 . . . LATCH CIRCUIT, 150 . . . RFIC, 151 . . . CONTROL SECTION, 152 . . . RADIO COMMUNICATION SECTION, 153 . . . DATA TRANSMISSION SECTION, 154 . . . PWM CONTROL SECTION, 155 . . . DATA RECEPTION SECTION, 156 . . . CONNECTION SWITCHING SECTION.

The invention claimed is:

1. A battery-type power supply device that is mountable in a battery box of an external load device, comprising:
a housing having a shape and dimensions which conform to battery standards;
a battery housing section that houses a built-in battery inside the housing, the battery housing section having an inner positive terminal and an inner negative terminal which make contact with front and rear terminals of the housed built-in battery;
an outer positive terminal that is provided at a front end face of the housing and connected to the inner positive terminal;
an outer negative terminal that is provided at a rear end face of the housing and connected to the inner negative terminal;
an output transistor that is interposed at least either between the inner negative terminal and the outer negative terminal or between the inner positive terminal and the outer positive terminal;
an antenna that is housed within the housing;
a radio communication section that performs radio communication with an external information processing device through the antenna;
a PWM control section that controls opening and closing of the output transistor at a duty ratio in accordance with an instruction that is received by the radio communication section from the external information processing device;
a transmission section that controls opening and closing of the output transistor to transmit data received by the radio communication section from the external information processing device or other data to the external load device through the outer positive terminal and the outer negative terminal; and
a connection switching section that switches between connections of the PWM control section and the transmission section to the output transistor.

2. The battery-type power supply device according to claim 1, wherein the transmission section transmits the data or the other data to the external load device by an asynchronous method or a synchronous method.

3. The battery-type power supply device according to claim 1, further comprising a reception section that receives data from the external load device through the outer positive terminal and the outer negative terminal.

4. The battery-type power supply device according to claim 3, wherein the reception section includes:
an operational amplifier that is connected to the outer positive terminal or the outer negative terminal through the output transistor;
a differentiation circuit that is connected to an output of the operational amplifier; and
a latch circuit that is connected to an output of the differentiation circuit.

5. The battery-type power supply device according to claim 3, wherein the radio communication section transmits data that is received from the external load device by the reception section to the external information processing device by radio transmission through the antenna.

6. The battery-type power supply device according to claim 3, wherein data that is transmitted from the external load device to the reception section represents at least one of an operating state of the external load device, a manipulation state of the external load device, and a detection value of a sensor included in the external load device.

7. A battery-type power supply device that is mountable in a battery box of an external load device, comprising:
a housing having a shape and dimensions which conform to battery standards;
a battery housing section that houses a built-in battery inside the housing, the battery housing section having an inner positive terminal and an inner negative terminal which make contact with front and rear terminals of the housed built-in battery;
an outer positive terminal that is provided at a front end face of the housing and connected to the inner positive terminal;

an outer negative terminal that is provided at a rear end face of the housing and connected to the inner negative terminal;

an output transistor that is interposed at least either between the inner negative terminal and the outer negative terminal or between the inner positive terminal and the outer positive terminal;

an antenna that is housed within the housing;

a radio communication section that performs radio communication with an external information processing device through the antenna;

an opening/closing control section that causes the output transistor to open and close in accordance with a power supply on/off instruction that is received by the radio communication section from the external information processing device;

a transmission section that controls opening and closing of the output transistor to transmit data received by the radio communication section from the external information processing device or other data to the external load device through the outer positive terminal and the outer negative terminal; and a connection switching section that switches between connections of the opening/closing control section and the transmission section to the output transistor.

8. A battery-driven load device, comprising:
a battery box that houses a battery-type power supply device having a radio communication function;
a load section driven by the housed battery-type power supply device as a power supply;
a reception section that receives reception data from the battery-type power supply device through a positive terminal and a negative terminal of the battery box;
a transmission section that transmits transmission data to the battery-type power supply device through the positive terminal and the negative terminal; and
a control section that controls the reception section and the transmission section,
wherein a branch line that branches off from a power supply line connected to the positive terminal is connected to the reception section, a pair of pull-down resistors being provided in parallel in the branch line, one of the pull-down resistors being connected to a ground through a switching element, the switching element being opened and closed so that a pull-down resistor value can be varied by control of the control section, and
wherein the negative terminal is connected through a transistor to another branch line that branches off from the power supply line, and the transistor is opened and closed in accordance with the transmission data from the transmission section.

* * * * *